US007554382B2

United States Patent
Miske et al.

(10) Patent No.: US 7,554,382 B2
(45) Date of Patent: Jun. 30, 2009

(54) METHOD FOR REDUCING INSERTION LOSS AND PROVIDING POWER DOWN PROTECTION FOR MOSFET SWITCHES

(75) Inventors: Myron J. Miske, Newfields, NH (US); Julie Stultz, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/673,259

(22) Filed: Feb. 9, 2007

(65) Prior Publication Data

US 2007/0194832 A1    Aug. 23, 2007

Related U.S. Application Data

(60) Provisional application No. 60/774,753, filed on Feb. 17, 2006.

(51) Int. Cl.
*H03K 17/16* (2006.01)
(52) U.S. Cl. .................. 327/382; 327/308; 327/407
(58) Field of Classification Search .................. None
See application file for complete search history.

(56) References Cited

U.S. PATENT DOCUMENTS

| 5,281,928 | A | * | 1/1994 | Ravid et al. ............... 333/81 R |
| 5,666,089 | A | * | 9/1997 | Ehlers ....................... 333/81 R |
| 5,689,209 | A | | 11/1997 | Williams et al. |
| 5,767,733 | A | | 6/1998 | Grugett |
| 5,818,099 | A | | 10/1998 | Burghartz |
| 5,828,873 | A | * | 10/1998 | Lynch ........................ 712/222 |
| 6,163,199 | A | | 12/2000 | Miske et al. |
| 6,194,952 | B1 | * | 2/2001 | Shigehara .................. 327/534 |
| 6,239,649 | B1 | | 5/2001 | Bertin |
| 6,281,737 | B1 | | 8/2001 | Kuang et al. |
| 6,335,653 | B1 | | 1/2002 | Shigehara et al. |
| 6,377,112 | B1 | | 4/2002 | Rozsypal |
| 6,489,856 | B1 | * | 12/2002 | Weigand ................... 333/81 R |
| 7,095,266 | B2 | * | 8/2006 | Miske ........................ 327/427 |
| 2003/0016072 | A1 | | 1/2003 | Ramakrishnan |

* cited by examiner

*Primary Examiner*—Tuan Lam
*Assistant Examiner*—Hiep Nguyen
(74) *Attorney, Agent, or Firm*—Cesari and McKenna, LLP; Edwin H. Paul, Esq.

(57) ABSTRACT

An FET switch comprising a single or parallel opposite polarity FETS is illustrated with wells that are driven from internal power rails. The internal power rails are logically coupled by other driving FET switches to, in one case, the higher of a positive power supply or signal level wherein the well of the PMOS FET switch will not allow the drain/source to well diode to be forward biased. In a second case, a second power rail is logically coupled to the lower of either and input signal or ground, wherein the well of the NMOS FET will not allow the drain/source to well diode to be forward biased.

15 Claims, 7 Drawing Sheets

METHOD FOR REDUCING INSERTION LOSS AND PROVIDING POWER DOWN PROTECTION FOR MOSFET SWITCHES

CROSS-REFERENCE TO RELATED APPLICATIONS

The present application claims the benefit of U.S. Provisional Patent Application Ser. No. 60/774,753, which was filed on Feb. 17, 2006, by the same inventors and having the same title. This provisional application is hereby incorporated herein by reference.

The present application is related to an application, owned by the same entity, entitled, Circuit and Method for Lowering Insertion Loss and Increasing Bandwidth in MOSFET Switches, Ser. No. 10/920,882, which was filed on Aug. 18, 2004. This prior application is hereby incorporated herein by reference.

BACKGROUND OF THE INVENTION

1. Field of the Invention

The present invention relates to MOSFET devices and particularly to MOSFET devices used as low on-impedance switches.

2. Background Information

MOSFET switches are found in many applications and have become common in high frequency switch applications. As technology progressed, such transistor switches became smaller, faster and more power efficient. Often these low on-impedance switches are used to transfer logic data between systems using different power sources, say a 5V system sending and/or receiving logic signals from a 3V system. Typically the power sources determine the high logic levels. Such switches may couple logic systems powered from 5V, 3.3V and/or 1.8V to each other.

Operation at the lower power supply levels, however, encounters issues with respect to threshold requirements inherent in MOSFET transistors. For example, in systems with differing power sources, trouble might be encountered where a logic signal sent from a system is higher than the power supply of the receiving system. Over/under voltage effects are known to cause catastrophic MOSFET failures.

One such approach to alleviating the above limitation is discussed in U.S. Pat. No. 6,163,199 ('199), entitled: "Overvoltage/Undervoltage Tolerant Transfer Gate." The '199 provides parallel transistors arranged for over under and under voltage protection. The '199 drives the back gates (bulk contacts) of the transfer transistors involved. The '199 patent is owned in common with the present application and shares a common inventor. The '199 patent provides a more detailed discussion of the limitations of the prior art along with an approach to help relieve the problem. The '199 patent is hereby incorporated herein by reference.

Other known designs have focused on lowering insertion loss and increasing the bandwidth by minimizing the "body effect" that is inherent in MOSFET structures. Insertion loss can be described, generally, as the loss of signal power delivered to a load due to the addition of a less than perfect switch compared to that if the switch were perfect.

The body effect becomes significant when the FET switch is turned on and neither the source nor the drain are at the same potential as the well. In such instances, the well acts like another gate (sometimes referred to as a "back gate") and produces a localized increase in the threshold voltage which in turn reduces the conduction between source and drain. That is, the switch on-resistance increases which, in turn, reduces the device bandwidth due to a frequency roll-off with the capacitance present. Bandwidth is defined herein as the −3 dB point on the continuous curve of insertion loss versus frequency.

A representative prior art design focused on reducing the body effect and insertion loss is found in U.S. Pat. No. 5,818,099 ('099) to Burghartz. The '099 patent describes an n-type MOSFET structure with a p-well that is isolated from the p-type substrate using n-type well as shown in FIG. 6A of the '099 patent. This type of structure is now commonly used by many makers of such switches, and this same basic structure may be used for n-type MOSFET structures in preferred embodiments of the present invention. The '099 patent is hereby incorporated herein by reference.

The '099 low insertion loss circuit embodiment, however, may have larger leakage when there is a signal voltage present and the supply voltage to the transfer switch is turned off, e.g., when power is turned off first to the transfer switch before it is turned off at the sending or receiving systems. Moreover, the switch may become turned on when it should be off during power down.

For example, in the prior art of FIG. 1, a p-type MOSFET is shown with typical biasing of the well to +V. This ensures that the drain/source to well pn junction diode does not become forward biased. However, if the +V supply is at ground (by the supply being turned off) while there is a high logic level, say +5V, at terminal A, the pn drainwell diode in the MOSFET switch is forward biased creating a potentially harmful current path that charges the output capacitor of the +V supply. So the well of the p-type MOSFET will be charged and, thus, the switch is powered when it should be unpowered. Also, the capacitance from the drain and the source to the well, Cdw and Csw, respectively, act to limit the bandwidth of the switch.

There remains in prior art MOSFET switches limitations for over voltage protection during power down operations and for insertion and bandwidth loss. The present invention is directed, inter alia, towards these limitations.

SUMMARY OF THE INVENTION

The limitations and issues in the prior art addressed by the present invention that provides a switch of a single or parallel primary FETs. The well or wells of the primary FETs are driven so that the drain/source to well diode junctions do not become forward biased when powered down. Additionally, insertion loss and bandwidths of the switch are enhanced.

For each of the switch primary FETs an internal power rail is formed and the wells for each are coupled or functionally connected to the higher of a local power supply or the input signal to the switch, whichever is higher for a PMOS, if a primary, and the lower of the ground or the input signal of an NMOS, if a primary.

Pairs of additional FETs connected in series are provided across the drain to source of the primary switch FETs. The sources of these additional FETs are connected to the wells of the primary FET, so that any input signal appears at the wells of the primary FETs. In such a case, the capacitance from the drain or source to the well of each of the primary FETs is effectively canceled from frequency rolling off of any AC input signal.

In a preferred embodiment, other FETs are used to logically gate a power supply, an input, and/or ground to the internal power rails and to the wells of the primary FETs.

BRIEF DESCRIPTION OF THE DRAWINGS

The invention description below refers to the accompanying drawings, of which.

DETAILED DESCRIPTION OF AN ILLUSTRATIVE EMBODIMENT

Figure 2:
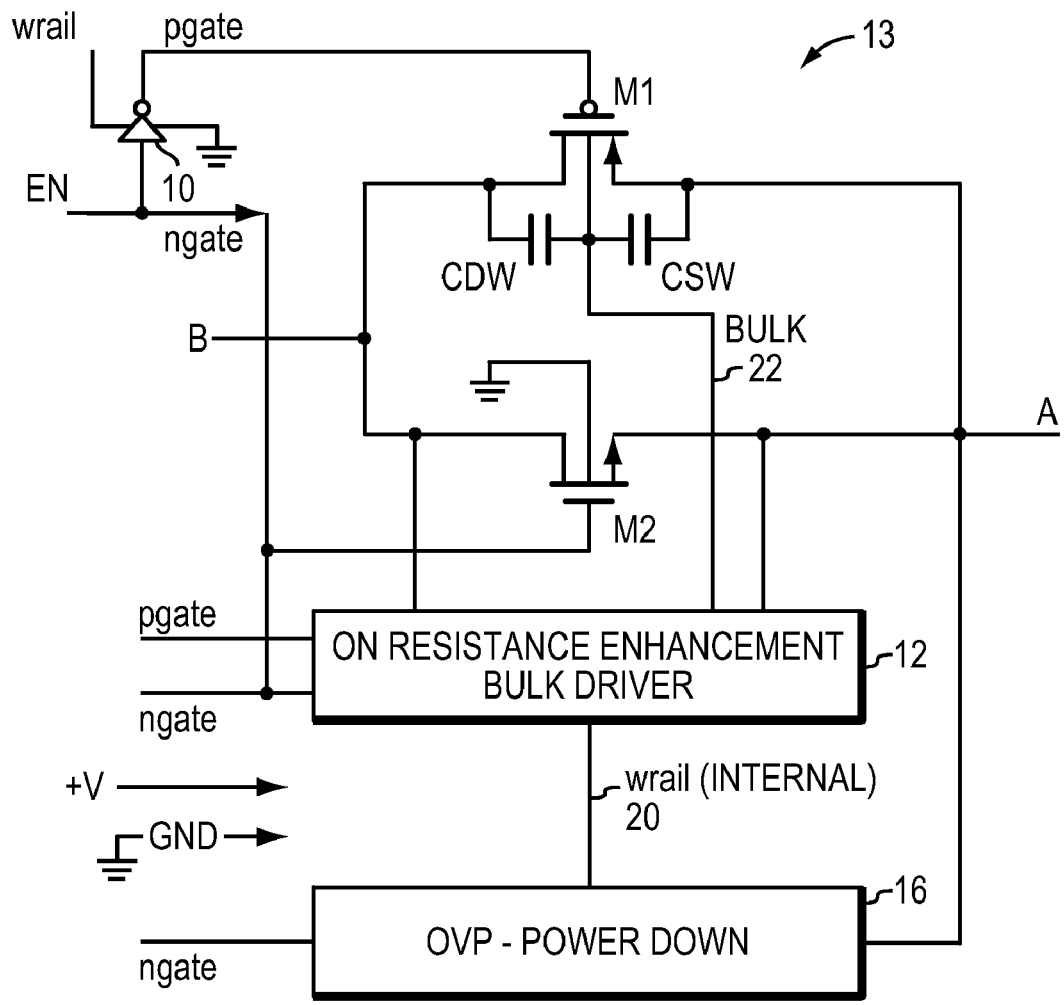
FIG. 2 is a schematic/block diagram illustrating an embodiment of the present invention.

FIG. 2 is a schematic/block diagram of an embodiment of the present invention. M1 is a p-type MOSFET with its source and drain connected in common to the source and drain, respectively, of an n-type MOSFET M2. The common drains are connected to an input/output B, and the common sources are connected to and input/output A. When the switch is on, M1 and M2 provide a low impedance connection between A and B. The term "switch" alone refers to the M1, M2 combination, item 13, unless context indicates a different meaning (e.g. "the M1 switch" would refer only to M1).

In FIG. 2 an input signal may be introduced at node A or node B and emerging from node B or A, respectively, when the switch is biased on. With the inverter 10, when EN (enable) is high, both M1 and M2 are turned on, and when EN is low, both M1 and M2 are off. The input signal Ngate (which is EN) turns M2 on when high and off when low. Pgate turns M1 on when low and off when high. Circuitry in block 12 drives the well of M1 and is designed to enhance the on-resistance, lower the insertion loss, and increase bandwidth as discussed below. Circuitry in block 16 protects the MOSFET switch during power down.

Note: bulk, back gate, body or well are used interchangeably herein, as known to those skilled in the art. In M1 the p-type substrate is tied to ground, and the well or back gate of M1 is clamped to at most a diode, D1, drop of about 0.7V below ground. D1 is the intrinsic (parasitic) diode from the substrate to the body of the p-type MOSFET, M1. In this embodiment, see FIG. 8A where the p-type substrate is grounded and the well of M1 is clamped to at most a diode, D1, drop of about 0.7V below ground.

Figure 8B:
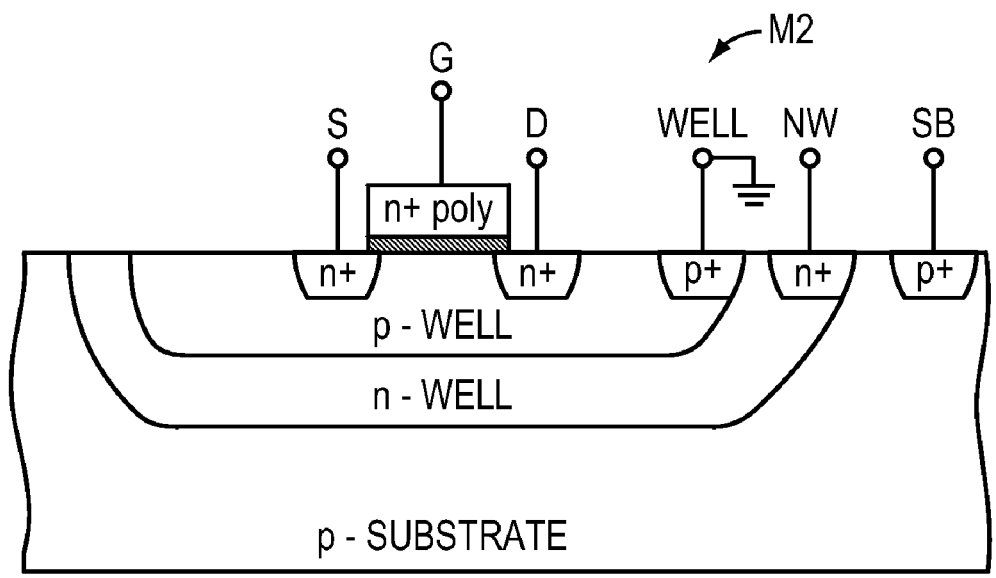
FIGS. 8A and 8B are cross section views of a PMOS and an NMOS structure that may be used for transistors M1 and M2.

The back gate B of M2 is tied to ground, as in FIG. 2 and FIG. 8B, but may be driven with circuits similar to those of items 12 and 16 for M1. See FIG. 9.

Figure 1:
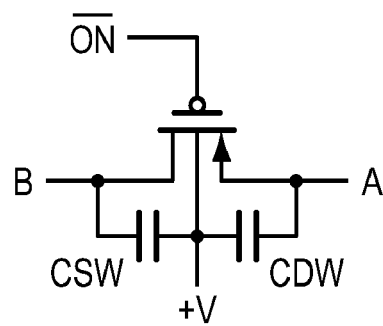
FIG. 1 is schematic of a prior art p-type MOSFET switch.
Figure 3:
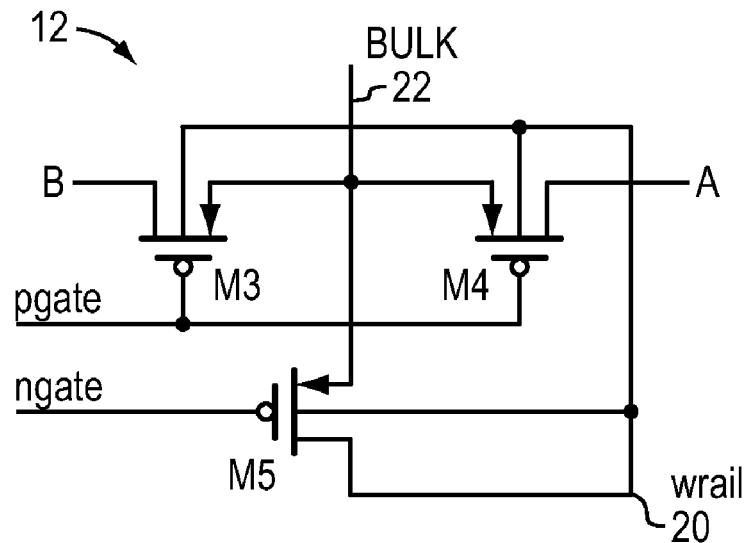
FIG. 3 is a schematic of an embodiment of the insertion loss circuit enhancement of the present invention.

FIG. 3 is a more detailed schematic of the circuit performance enhancing circuitry of block 12 of FIG. 1. PMOS M1 is fabricated in an isolated N well (see FIG. 8A) that is connected to bulk 22 driven by M3 and M4. In this embodiment, two P-type MOSFET's, M3 and M4, are tied in series from node A to node B with their sources tied to bulk 22 that is connected to the well of M1. When ngate is low, the switch 13 is off and wrail 20 is connected to the bulk 22 via M5. Wrail also biases the wells of M3 and M4. M3 and M4 and the use of wrail lowers insertion loss and enhances power down operation as described herein.

Referencing FIGS. 2 and 3, when EN is low, the switch 13 is off, ngate is low, pgate is high and the MOSFETs M1, M2, M3, and M4 are all off. M5 is on connecting the wells of M1, M3 and M4 to the wrail 20. Typically M3 and M4 are made of equal size and characteristics. Any potential drop, Vds, across M1, is equally dropped with one half across M3 and one half across M4. This maintains the symmetry of this preferred embodiment.

The symmetrical functions of M3 and M4, in FIG. 3, demonstrate a lowered insertion loss and higher bandwidth of the present invention compared to known circuits. As discussed above, with respect to FIG. 2, when M1 is on, an AC signal appears at both the source and drain of M1. Even with minimal drop across M1, some of that AC signal would be siphoned off through capacitors from both the source and the drain, Csw and Cdw, to the well of M1, if the well were connected to a low impedance point (+V or to ground for N-types). However, in the present invention, when M3 and M4 are on, their low on resistances will tend to maintain a substantially constant voltage across both Csw and Cdw and thereby limit AC signal siphoning through these capacitors. This reduces the insertion loss with frequency and increases the bandwidth of the switch.

Figure 4:
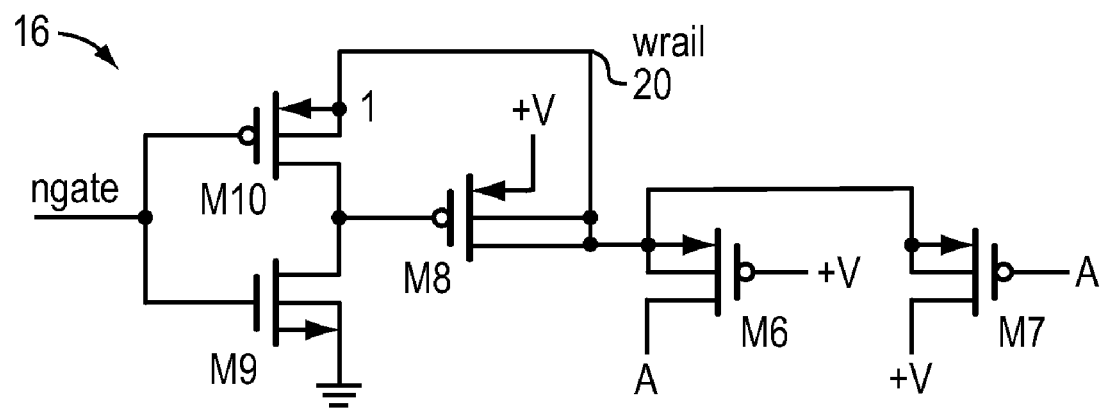
FIG. 4 is a schematic of the over voltage protection/power down circuitry.

Item 16 of FIG. 2 is detailed in FIG. 4, and illustrates circuitry that provides power down protection for the MOSFET switches, M1, M2, M3 and M4 by implementing the internal power wrail 20. When the EN is false, M1, M2, M3 and M4 are all off (the switch is off), there is a high impedance connection between A and B. The bulk 22 is connected to the wrail 20 voltage via M5, not the power supply, +V, as in the prior art. The bulk 22 is connected to higher of the A signal level via M5 and M6 of FIG. 4, when the supply voltage +V is grounded, or to +V when the A signal level is low via M5 and M7. This eliminates the possibility of forward biasing the pn diode from the drain/source to the well of M1.

In FIG. 4 wrail 20 connects to the wells of PMOS M8, PMOS M5, to the PMOS M10, and to the well of PMOS M3, M4, M6, and M7. When the switch 13 is on, M5 of FIG. 3 is off and wrail and bulk 22 are not connected. However, if A and B are high, and +V goes to ground, the bulk 22 connected to the well of M1 is at the A level via M3 and M4. If A and B are low, the well of M1 will be driven to the low A level still via M3 and M4. In each case, the well of M1 will not be biased lower than its drain/source and so the drain/source to well pn junction of M1 will not be forward biased.

Restating some of the above discussion, with respect to FIGS. 3 and 4, under normal operating conditions with +V about equal to the logic levels that might appear at A and B, when EN is low, the switch (item 13, FIG. 2) is off. Pgate is high and Ngate low. M10 is on and M8 is off. M6 is off and M7 may be on if A is low. If so, the wrail 20 is driven to +V via M7. If A is high and +V goes to ground, then wrail 20 is driven to the high A level via M6. In these two cases, the bulk 22 connected to the well of M1 is connected to wrail 20 via M5 and to +V via M7 or a high A via M6. Within threshold levels, the well of M1 will not fall below the high level of the A signal or +V. The well of M1 cannot go to ground with high level at A.

Figure 6:
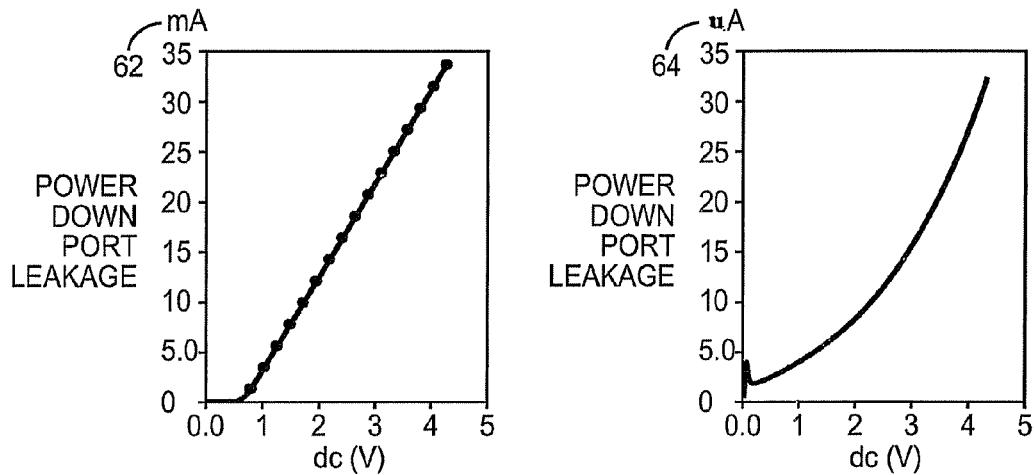
FIG. 6 is a trace illustrating the lower leakage from the input/output signals through an off switch.
Figure 5:
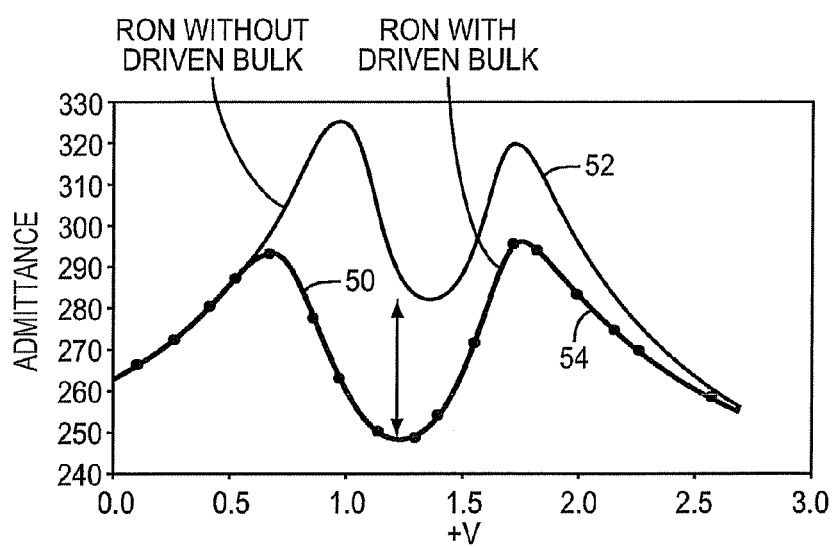
FIG. 5 is a trace illustrating the improvement in insertion loss using the present invention.

FIG. 5 illustrates improved insertion loss 50 between the driving 54 of the well or bulk connection of the switch M1 and the prior art, where it is tied 52 to the supply voltage (for the p-type MOSFET). FIG. 6 is a comparison of leakage from an input/output through an off switch where power down operations may affect leakage. Note that in the prior art circuit the leakage current 62 axis is in ma (milliamps), while in the inventive circuit the scale is in ua (microamps).

In practical applications there is a tradeoff between smaller switch structures, with smaller capacitances that increase bandwidth, but with higher "on" impedances that reduce bandwidth. The present invention, with improved bandwidth, moves this tradeoff off to a higher frequency. In simulated circuits, an inventive n-type MOSFET switch with a nominal on resistance of four ohms has a bandwidth of 1.6 GHz compared to 350 MHz for a prior art design.

Referencing FIG. 1, in other preferred embodiments, pgate and ngate may be separately driven to arrange switch logic states where M1 may be on when M2 is off and visa-versa.

Figure 7:
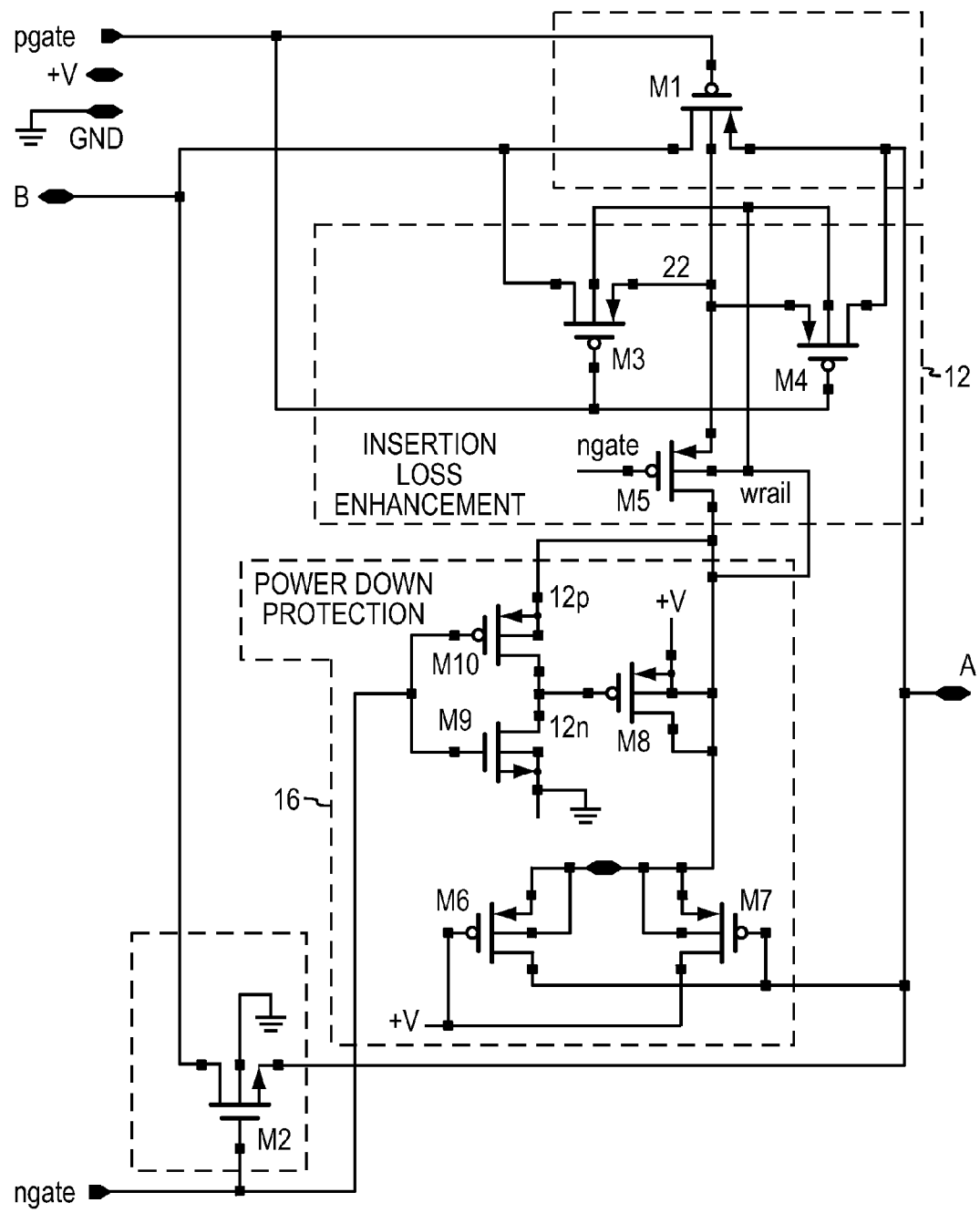
FIG. 7 is a composite schematic of an embodiment illustrated in FIGS. 2, 3 and 4.

FIG. 7 is a composite circuit that combines the circuitry of FIGS. 2, 3 and 4, less the inverter 10 (of FIG. 1).

Figure 8A:
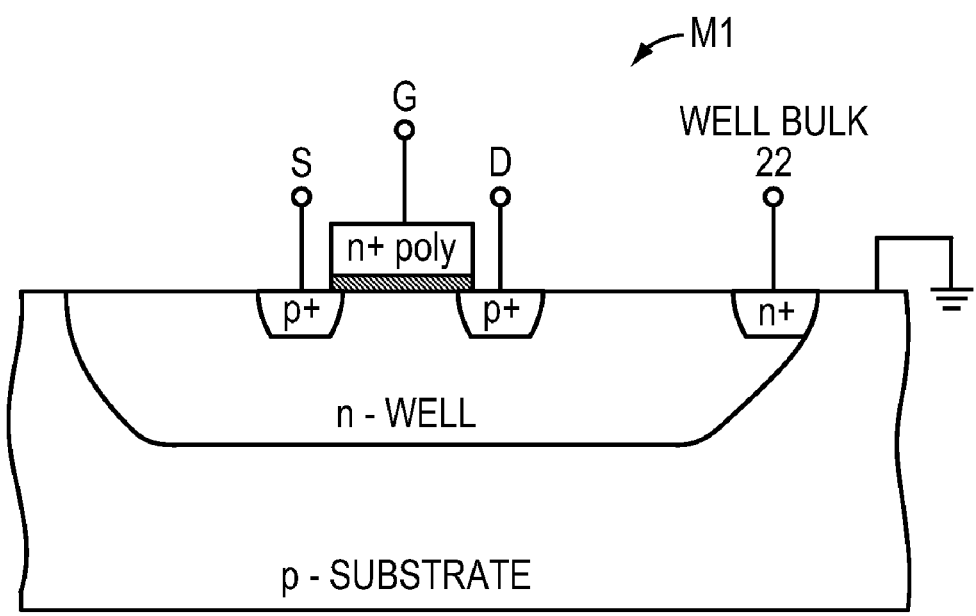

FIG. 8A shows a cross section view of PMOS M1 and FIG. 8B shows that of an isolated NMOS M2. The pn junctions indicate diodes that may affect power down operations.

Figure 9:
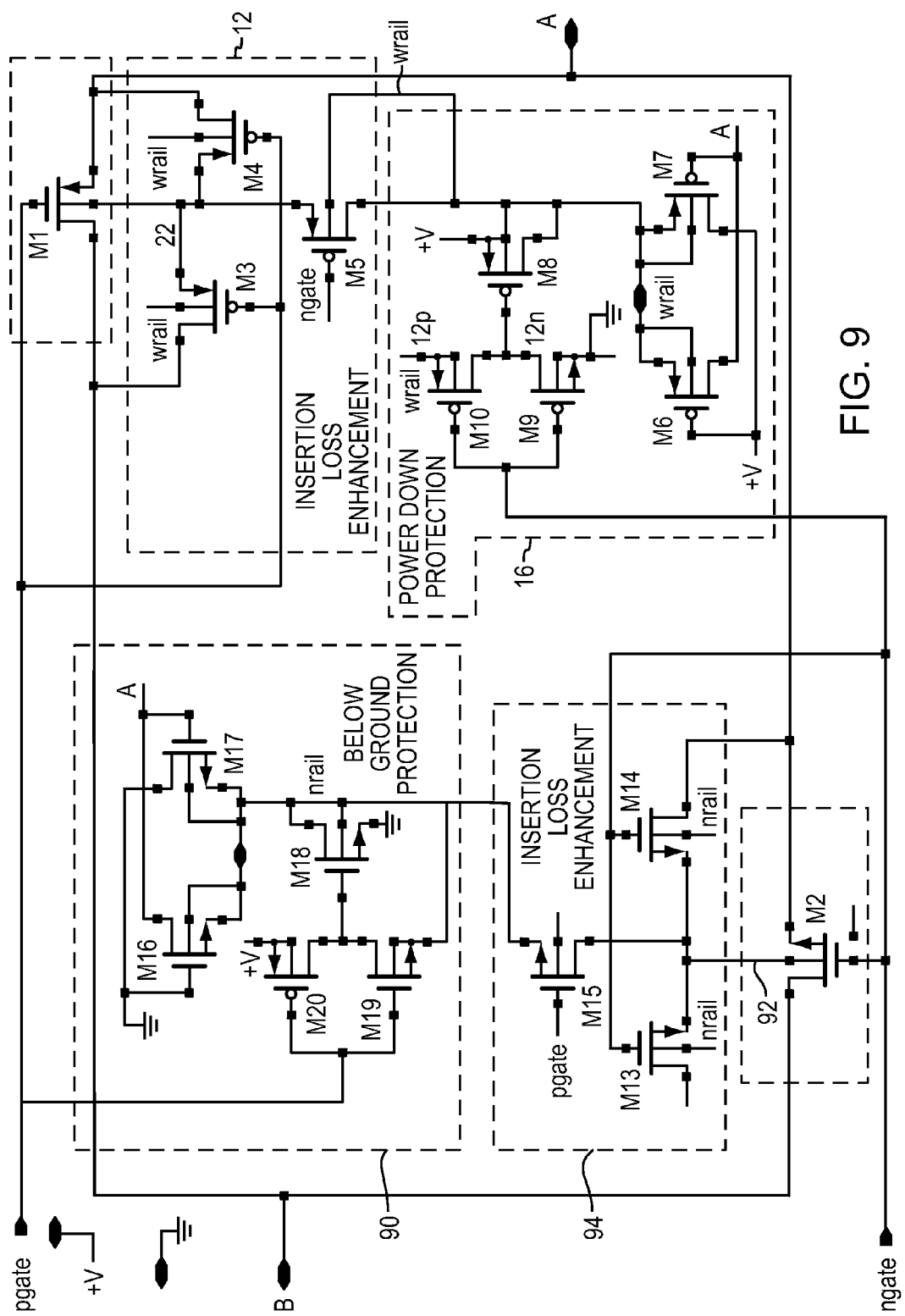
FIG. 9 is a schematic showing circuitry for an NMOS and PMOS implementation of an embodiment of the invention.

FIG. 9 illustrates a full NMOS and PMOS schematic implementation of the invention that includes a circuit 90 that protects M2 against below ground operation and 94 that enhances bandwidth and insertion loss with respect to M2.

Figure 10:
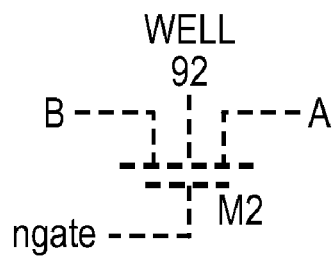
FIG. 10 is a composite schematic of an insertion loss and bandwidth enhancement circuit.
Figure 10:
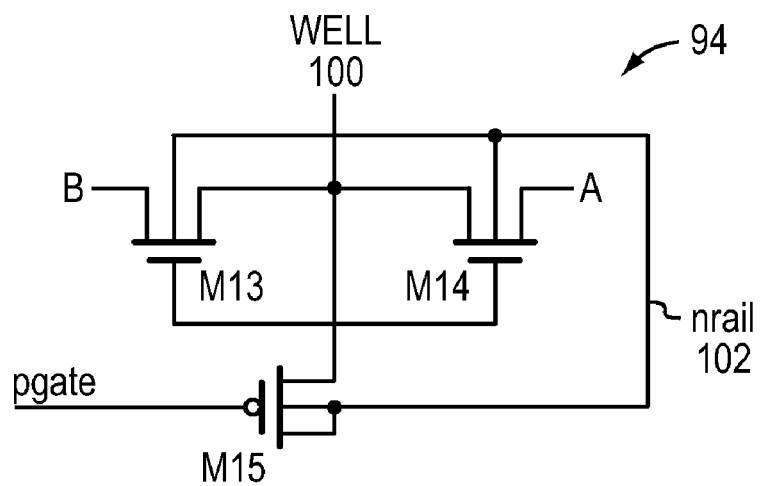

FIG. 10 includes a schematic of item 94 that is similar to item 12 of FIG. 3 and item 90 that is similar to item 16 of FIG. 3. Of note, the M2 transistor P type well 92 is not connected to ground, but is connected to the sources of N type M13 and M14 that provide a function similar to that of M3 and M4 for the M1 well. M15 provides a function similar to that of M5, and M16 and M17 also function as do M6 and M7. M18, M19 and M20 operate similarly to M8, M9 and M10. The net effect is to reduce insertion loss, enhance bandwidth and prevent the forward biasing of the pn junction of the well of M2 and its drain/source.

As a note, the NMOS symbols of FIG. 9 show five terminals, but actually there are six as shown in FIG. 8B. FIG. 8B illustrates the construction of an isolated NMOS transistor having a source, S, gate G, drain D, bulk or well, an isolation layer NW and the substrate SB. The isolation layer NW is biased to prevent forward biasing the pn junctions.

Figure 11:
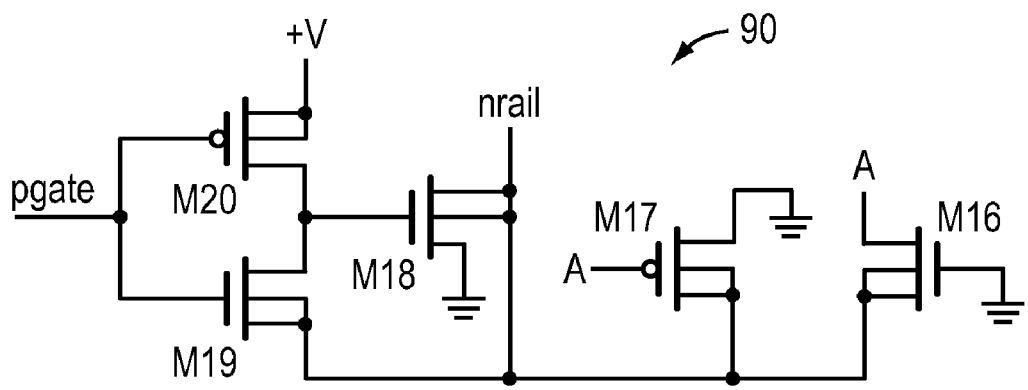
FIG. 11 is a circuit that enhances power down operations circuits for the N-type switch M2.

The switch NMOS (M2) P well is driven with the circuit of FIG. 10. This circuit couples to the well of M2 to enhance bandwidth, lower insertion loss and enhance power down circumstances by driving the well of M2. The circuit of FIG. 11 drives a second internal power rail created by the circuit of FIG. 10. The circuits of FIGS. 10 and 11 are similar to those in FIGS. 3 and 4 that are coupled to M1. When the switch is closed (M1 and M2 on), the P well of the switch NMOS (M2) is driven by NMOS M13 and M14. When the switch is open, the P well 92 of M2 is tied to the nrail 102 through NMOS M15. The nrail supply connects to the P wells of M13, M14, M15, M16, M17, M18, and M19. During the closed state of the switch, nrail is pulled to pwrn through NMOS M18. If the ground power (pwrn) drops to a negative voltage level and the 'A' switch port is above ground, nrail will be pulled to the negative voltage level through M17. When the ground supply (pwrn) is at ground and the 'A' switch port is pulled to a negative voltage level, the nrail will be pulled to the negative voltage value through NMOS M16. The result is that the pn junction in M2 will not be forward biased as discussed above.

What is claimed is:

1. A switch comprising:
    a first field effect transistor, FET, having a gate, source, drain, and well, wherein an input signal A is received on the drain or the source and an output signal is presented to the source or drain, respectively, when the first FET is on;
    a first internal power rail;
    a second FET arranges so that, when the first FET is turned off, the second FET is turned on coupling the well of the first FET to the first internal power rail;
    a third FET that couples the first internal power rail to a positive power supply when the input signal goes low; and
    a fourth FET that couples the first internal power rail to the input signal A when the positive power supply goes low, wherein, when the second FET is on, the well of the first FET will be maintained at the higher of the positive power supply or the A input signal.

2. The switch of claim 1 further comprising:
    fifth and sixth FETs of the same polarity as the first FET, the fifth and the sixth FET arranged with their sources coupled together and the drain of the fifth FET coupled to the drain of the first FET and the drain of the sixth FET coupled to the source of the first FET; and
    the wells of the fifth and the sixth FET coupled to the first internal rail, and the sources of the fifth and the sixth coupled to the well of the first FET, wherein the fifth and sixth FETs are turned on and off with the switch being turned on and off.

3. The switch of claim 1 wherein the first FET is a P type.

4. The switch of claim 1 further comprising:
    a seventh FET having a gate, source, drain and well of opposite polarity from the first FET, the seventh FET having its drain and its source coupled to the drain and source, respectively, of the first FET;
    a second internal power rail;
    an eighth FET arranges so that, when the seventh FET is turned off, an eighth FET is turned on coupling the well of the seventh FET to the second internal power rail;
    a ninth FET that couples the second internal power rail to ground when the input signal goes low; and
    a tenth FET that couples the second internal power rail to the input signal when the ground signal level rises, wherein the well of the seventh FET will be maintained at the lower of ground or the A input signal.

5. The circuit of claim 4 further comprising:
    eleventh and twelfth FETs of the same polarity as the seventh FET, the eleventh and twelfth FETs arranged with their sources coupled together and the drain of the eleventh coupled to the drain of the seventh FET and the drain of the twelfth coupled to the source of the seventh FET; and
    the wells of the eleventh and twelfth FETs coupled to the second internal rail, and the sources of the eleventh and twelfth FETs coupled to the well of the seventh FET, wherein the eleventh and twelfth FETs are turned on and off with the switch being turned on and off.

6. The circuit of claim 2 further comprising:
    a first enable input signal coupled to the gates of the first, fifth and sixth FETs, the enable turning on these FETs when true and off when false.

7. The circuit of claim 5 further comprising:
a second enable coupled to the gates of the seventh, eleventh and twelfth FETs, the second enable turning on these FETs when true and off when false.

8. The circuit of claim 7, wherein the second enable is the logic inverse of the first enable.

9. A method for connecting and disconnecting an input signal A from an output, the method comprising the steps of:
turning on first field effect transistor, FET, having a gate, source, drain, and well, wherein when the first FET is turned off;
turning on a second FET coupling the well of the first FET to an internal power rail;
turning on a third FET that couples the internal power rail to a positive power supply when the input signal A goes low; and
turning on a fourth FET that couples the internal power rail to the input signal A when the positive power supply goes low, wherein, when the second FET is turned on, the well of the first FET is maintained at the higher of the positive power supply or the input signal A.

10. The method of claim 9 further comprising the steps of:
coupling the sources together of a fifth and sixth FET of the same polarity as the first FET;
coupling the drain of the fifth FET to the drain of the first FET and the drain of the sixth FET to the source of the first FET; and
coupling the wells of the fifth and the sixth FETs to the internal rail, and coupling the wells of the fifth and the sixth FET to the well of the first FET, wherein the fifth and sixth FETs are turned on and off with the switch being turned on and off.

11. The method of claim 9 further comprising the steps of:
coupling a drain and source of a seventh FET, the seventh FET having a gate, source, drain and well of opposite polarity from the first FET, to the drain and source, respectively, of the first FET;
turning on an eighth FET that couples the well of the seventh FET to a second internal power rail when the seventh FET is turned off;
turning on a ninth FET that couples the second internal power rail to the input signal when the input signal goes negative with respect to the ground; and
turning on a tenth FET that couples the second internal power rail to the ground signal if the ground signal goes negative with respect to the input signal.

12. The method of claim 11 further comprising the steps of:
coupling the sources together of an eleventh and twelfth FET of the same polarity as the seventh FET;
coupling the drain of the eleventh to the drain of the first FET and the drain of the twelfth to the source of the seventh FET; and
coupling the wells of the eleventh and twelfth FETs to the internal rail, and coupling the wells of the eleventh and twelfth to the well of the seventh FET, wherein the eleventh and twelfth FETs are turned on and off with the switch being turned on and off.

13. The method of claim 10 further comprising the steps of:
coupling a first enabled input signal to the gates of the first, fifth and sixth FETs that turns on these FETs when true and off when false.

14. The method of claim 12 further comprising:
coupling a second enable to the gates of the seventh, eleventh and twelfth FETs that turns on these FETs when true and off when false.

15. The method of claim 14, wherein the second enable is the logic inverse of the first enable.

* * * * *